United States Patent [19]
Tsubono

[11] Patent Number: 5,988,391
[45] Date of Patent: *Nov. 23, 1999

[54] ELECTRONIC PARTS CASING

[75] Inventor: Masanori Tsubono, Komatsu, Japan

[73] Assignee: Murata Manufacturing Co., Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 08/801,203

[22] Filed: Feb. 18, 1997

[30] Foreign Application Priority Data

Feb. 19, 1996 [JP] Japan ................................. 8-030905

[51] Int. Cl.⁶ ............................................. B65D 85/00
[52] U.S. Cl. ......................................... 206/701; 220/780
[58] Field of Search .................................. 206/701, 508, 206/509, 561, 719, 721–724; 220/780, 781, 784

[56] References Cited

U.S. PATENT DOCUMENTS

| | | | |
|---|---|---|---|
| 2,780,259 | 2/1957 | Nalle, Jr. | 220/780 |
| 4,819,795 | 4/1989 | Swaney | 206/508 |
| 5,515,992 | 5/1996 | Rink | 220/784 |
| 5,540,342 | 7/1996 | Rathbun | 220/784 |

Primary Examiner—Paul T. Sewell
Assistant Examiner—Luan K. Bui
Attorney, Agent, or Firm—Ostrolenk, Faber, Gerb & Soffen, LLP

[57] ABSTRACT

An electronic parts casing which can be easily formed, which allows a reduction in size and which resists deformation. The electronic parts casing is composed of a frame member, an inner cover and an outer cover, and is divided into two chambers by a partition provided inside the frame member. On the outer side surfaces of the frame member, there are provided ridges for the engagement of the outer cover, and, in the periphery of the outer cover, there are provided detents to be engaged with the outer ridges of the frame member. On the top surface of the inner cover, there are provided outwardly convex draw surfaces, and, on the top surface of the outer cover, there is provided an outwardly convex draw portion, which has on its inner side an inwardly convex draw surface. The inner cover is placed in contact with the upper edges of the inner cover and of the partition. The convex draw surfaces provided on the inner cover are brought into close contact with the convex draw surface provided on the outer cover, and the detents of the outer cover are engaged with the ridges of the frame member to thereby cause the outer cover to be engaged with and fixed to the frame member.

12 Claims, 6 Drawing Sheets

5,988,391

ELECTRONIC PARTS CASING

BACKGROUND OF THE INVENTION

1. Field of the Invention

The present invention relates to an electronic parts casing for high-frequency equipment such as a tuner.

2. Description of the Related Art

A conventional electronic parts casing will be described with reference to FIGS. 3 and 4. FIGS. 3 and 4 show a conventional electronic parts casing 100, which consists of a frame member 1 and inner and outer covers 2 and 3 covering the top of the frame member. The frame member 1 is divided into chambers 40 by a partition 1a provided inside the frame member 1. The frame member 1 includes edges 4 having tongues 5 for fastening the inner cover 2 and the outer cover 3. Further, two outwardly convex draw surfaces 6 are provided in correspondence with the two chambers 40, the area of each draw surface 6 being smaller than that of the corresponding chamber 40.

As shown in FIG. 4, the electronic parts casing 100 is formed as follows: the inner cover 2 is brought into contact with the edges 4 of the frame member 1, and the outer cover 3 is placed on the inner cover 2 to cover the same. The draw surfaces 6, provided on the inner cover 2, are brought into close contact with the inner surface of the outer cover 3, and the tongues 5 provided on the frame member 1 are inserted into cutouts 8 and through-holes 7 provided in the inner cover 2 and the outer cover 3. Then, the tongues 5 are twisted, whereby the inner cover 2 and the outer cover 3 are engaged with and fixed to the frame member 1.

The electronic parts casing 100 has a double structure, which is composed of the inner cover 2 to be brought into contact with the edges 4 of the frame member 1, and the outer cover 3 provided to be pressed against the inner cover 2. The frame member 1 is divided into two chambers 40 by a partition, and an electronic part (not shown), such as a tuner substrate, is accommodated in each chamber 40.

Generally speaking, in an electronic parts casing, it is necessary to shield the chambers from each other in order that a radio wave signal generated from one electronic part, such as a tuner, may not affect other electronic parts. In this electronic parts casing 100, the inner cover 2 and the edges 4 of the frame member 1 and of the partition 1a are completely held in close contact with each other due to the resilient force generated by the close contact of the draw surfaces 6 of the inner cover 2 with the inner surface of the outer cover 3, so that a radio wave signal or the like generated from an electronic part in one chamber 40 is not allowed to leak to the other chamber.

However, the conventional electronic parts casing 100, described above, has the following problems:

In the electronic parts casing 100, when engaging the frame member 1 with the inner cover 2 and the outer cover 3 or when detaching the inner cover 2 and the outer cover 3 from the frame member 1, the tongues 5 are twisted, so that it takes a lot of man-hours to assemble the casing 100. In particular, when repairing the electronic parts in the casing 100, the tongues 5 are twisted reversely to remove the inner cover 2 and the outer cover 3, and, after the repair, the tongues 5 are twisted again for engagement. This operation takes a lot of time. Further, due to the deterioration in the strength of the base portions of the tongues 5 and the deformation of the tongues 5, the inner cover 2 and the outer cover 3 cannot be completely fixed.

Further, due to the provision of the tongues 5, which protrude from the frame member 1, there is a limitation in the possible reduction of size. Further, when stamping out the frame member 1 from a metal plate (not shown), it is necessary to stamp out the tongues 5, with the result that a lot of time is required. Further, a surplus area of the metal plate is required, resulting in a rather high cost.

FIGS. 5 and 6 show an electronic parts casing 110 in which the above problems have been solved.

The electronic casing 110 shown in FIGS. 5 and 6 are composed of a frame member 10, and inner and outer covers 11 and 12 covering the top of the frame member. Of these, the frame member 10 is divided into a plurality of chambers 41 by a partition 10a provided inside the frame member 10. On the outer side surfaces of the frame member 10, there are provided ridges 14 for the engagement of the outer cover 12. In the periphery of the outer cover 12, there are provided detents 15 to be engaged with the ridges 14 provided on the side surfaces of the frame member 10. Further, on the top surface of the inner cover 11, there are provided outwardly convex draw surfaces 16 in correspondence with the two chambers 41, the area of each draw surface being smaller than that of the corresponding chamber 41.

As shown in FIG. 6, in the electronic parts casing 110, the inner cover 11 is placed on the frame member 10 such that it is in contact with the edges 17 of the frame member 10 and of the partition 10a. The outer cover 12 is placed on the inner cover 11, and the draw surfaces 16 provided on the inner cover 11 are brought into close contact with the inner surface of the outer cover 12. The detents 15 provided on the outer cover 12 are engaged with the ridges 14 provided on the frame member 10, whereby the outer cover 12 is engaged with and fixed to the frame member 10 from above the inner cover 11.

In the electronic parts casing 110, constructed as described above, the above-mentioned problems of the electronic parts casing 100 have been eliminated. However, it has the following problems:

In the electronic parts casing 110, the detents 15 provided on the outer cover 12 are engaged with the ridges 14 provided on the frame member 10, and the outer cover 12 is engaged with and fixed to the frame member 10 from above the inner cover 11. In this construction, the frame member 10 is subject to deformation due to the load applied to the ridges 14. Further, as a result of the deformation of the frame member 10, there is a concern that the electronic parts (not shown) in the frame member 10 will be damaged.

According to a method for preventing such deformation of the frame member 10, the thickness of the outer cover 12 is made smaller than that of the frame member 10. In this case, however, it is generally necessary for the outer cover to be formed in a thickness ranging from approximately 0.2 to 0.4 mm. In the case of a metal plate of this thickness (e.g., iron plate), deformation, such as warpage, is liable to be generated during working. When the outer cover 12 thus formed is used in the electronic parts casing 110, the resilient force generated from the close contact between the draw surfaces 16 of the inner cover 11 and the inner surface of the outer cover 12 is degenerated by the deformation, with the result that the close contact between the inner cover 11 and the edges 17 of the frame member 10 and of the partition 10a is cancelled, resulting in the RF signal, etc. generated by the electronic part in one chamber 41 leaking into the other chamber.

SUMMARY OF THE INVENTION

It is an advantage of the present invention to provide an electronic parts casing which can be easily formed, which can be reduced in size and which is free from deformation.

To achieve the above advantage, there is provided, in accordance with the present invention, an electronic parts casing comprising at least a frame member, and inner and outer covers covering the top of the frame member, wherein the frame member is divided into a plurality of chambers by a partition provided inside the frame member, the frame member having on its outer sides ridges for the engagement of the outer cover, the outer cover having in its periphery detents to be engaged with the ridges provided on the side surfaces of the frame member, the inner cover having on its upper surface outwardly convex draw surfaces in correspondence with the plurality of chambers, each draw surface having an area smaller than that of the corresponding chamber, the outer cover having on its top surface an outwardly convex draw portion, which has on its inner side an inwardly convex draw surface. The inner cover is configured so that when the outer cover is engaged with and fixed to the frame member from above the inner cover, the detents provided on the outer cover being engaged with the ridges provided on the frame member, the inner cover is brought into contact with the upper edges of the frame member and of the partition, and the convex draw surfaces provided on the inner and outer covers are brought into close contact with each other.

In the above construction, a convex draw portion is provided on the outer cover, whereby the outer cover is reinforced, so that no deformation such as warpage is generated during working.

Further, the engagement of the inner cover with the outer cover is easily effected and, even when the engagement is repeated a plurality of times, the draw surfaces of the inner and outer covers are held in contact with each other, so that the inner and outer covers are stably secured to each other.

Further, since the draw portions of the inner cover are provided in correspondence with the chambers of the frame member, leakage of an RF signal, etc., from one chamber to another can be prevented.

Further, since no tongues are used for fixation as in the conventional electronic parts casing, a reduction can be achieved in the height and size of the casing.

Other features and advantages of the present invention will become apparent from the following description of an embodiment of the invention which refers to the accompanying drawings.

DESCRIPTION OF AN EMBODIMENT

An embodiment of the present invention will now be described with reference to the drawings.

Figure 1:
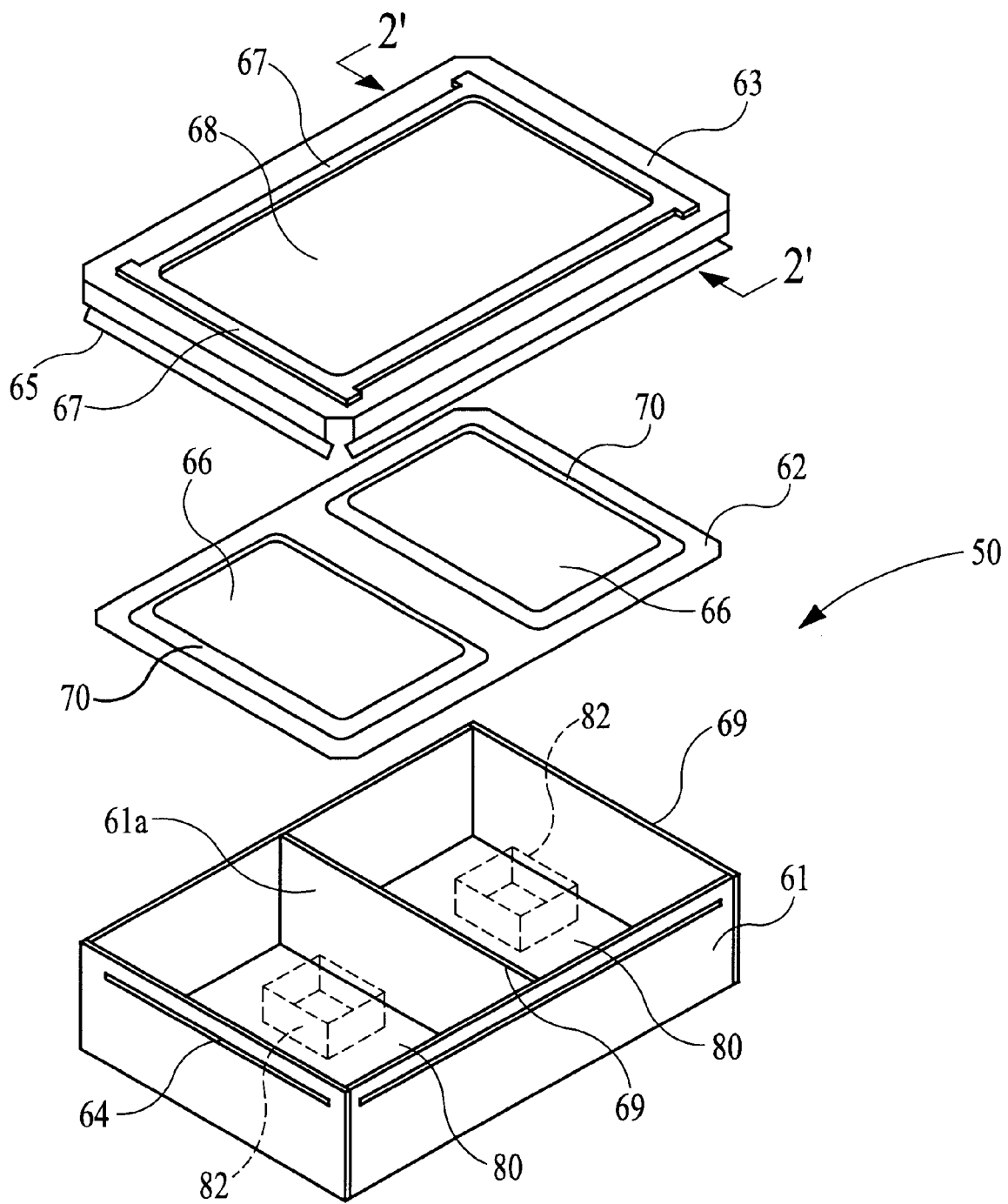
FIG. 1 is an exploded perspective view showing the construction of an electronic parts casing according to an embodiment of the present invention.
Figure 2:
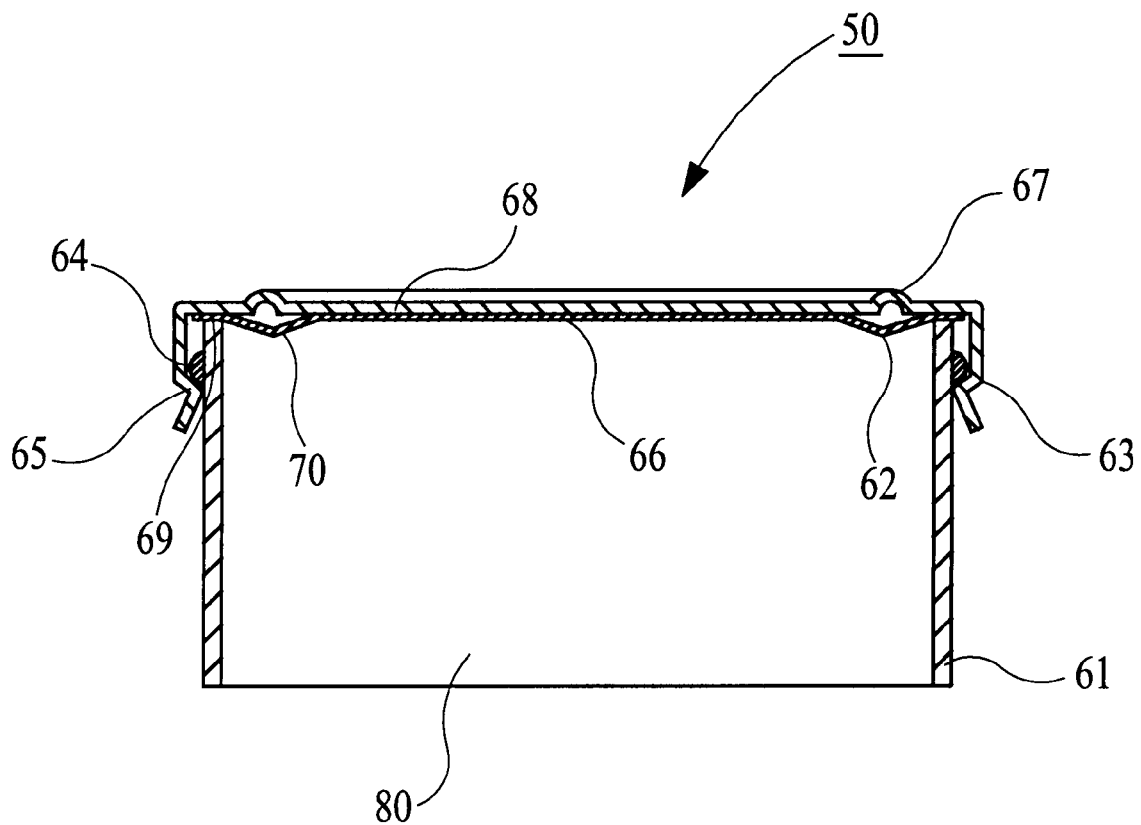
FIG. 2 is a sectional view taken along line 2'—2' of FIG. 1.
Figure 3:
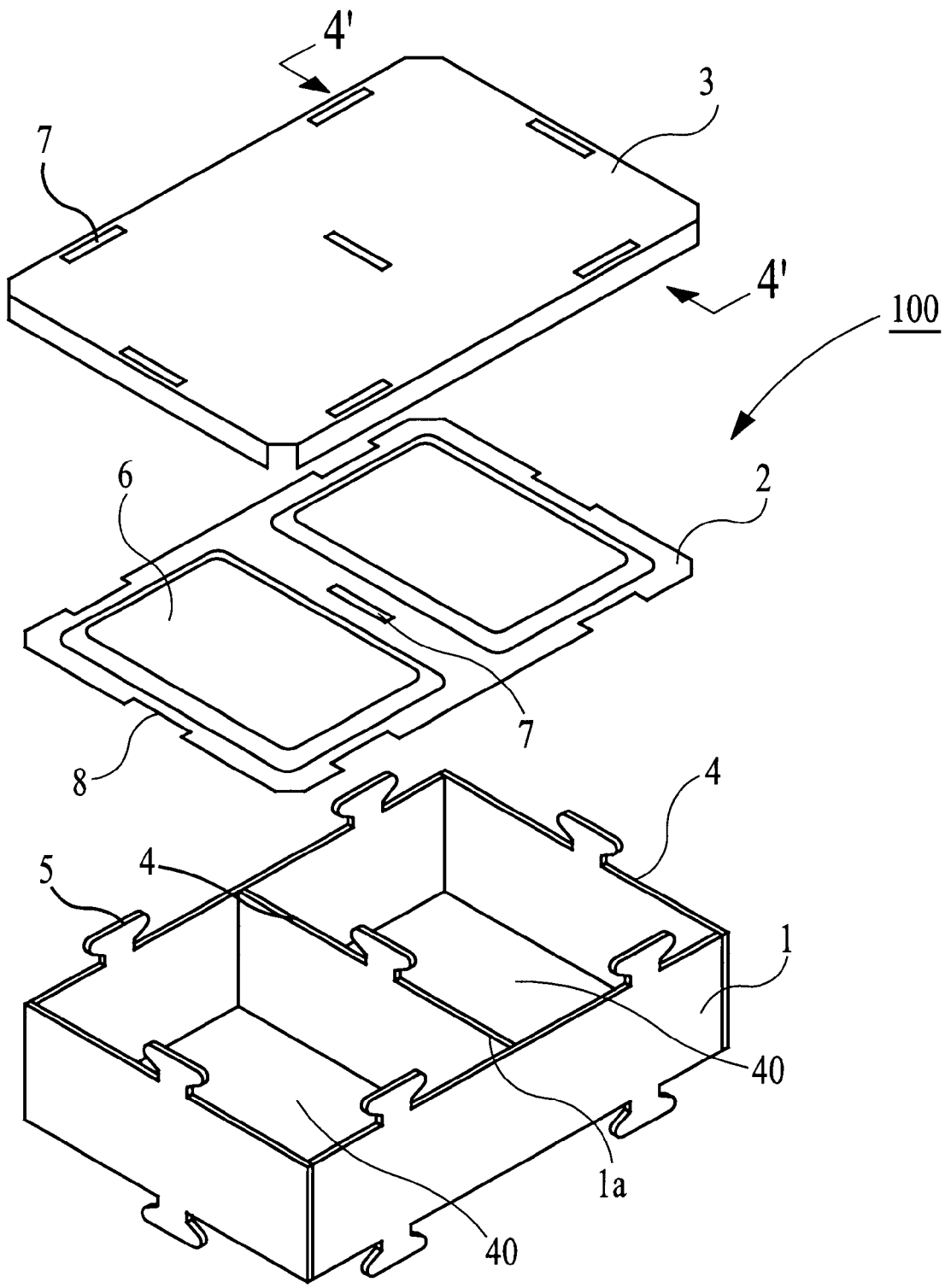
FIG. 3 is an exploded perspective view showing the construction of a conventional electronic parts casing.
Figure 4:
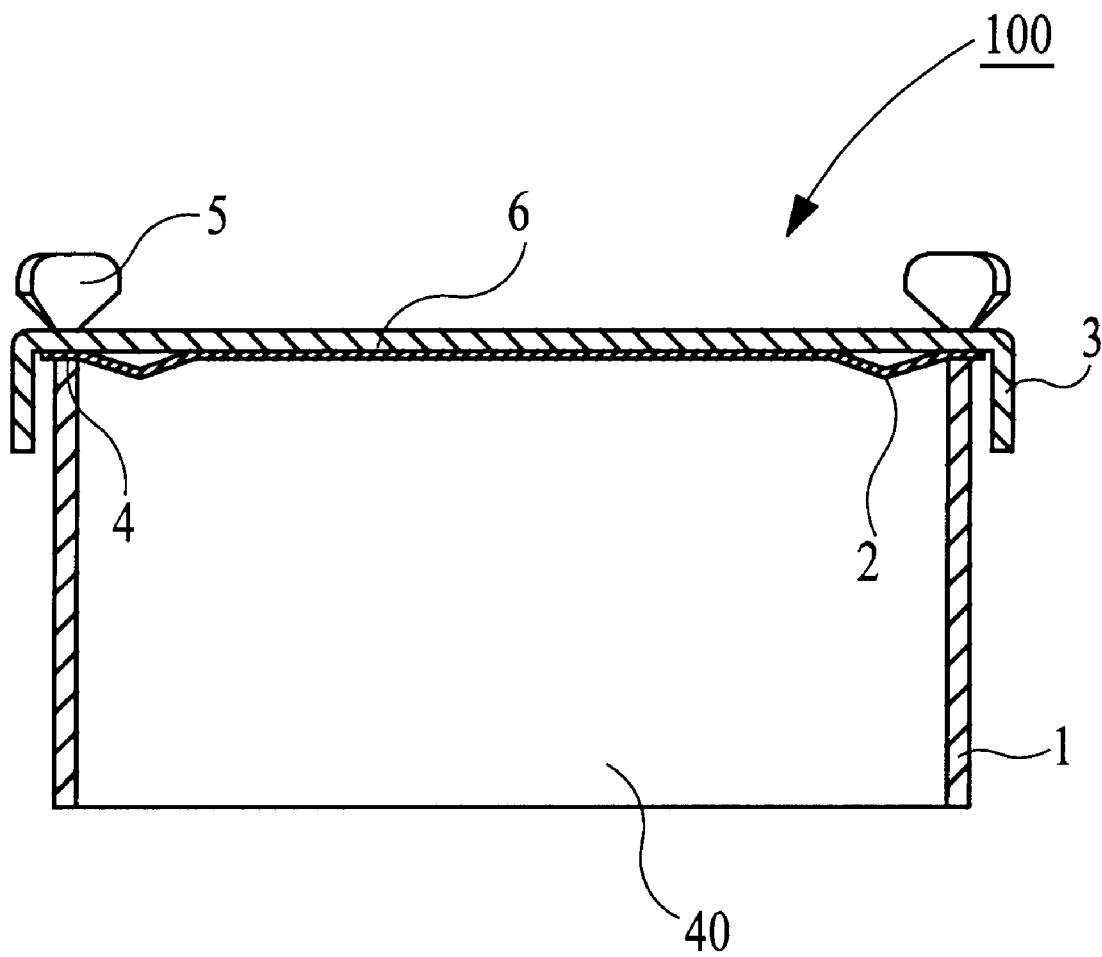
FIG. 4 is a sectional view taken along line 4'—4' of FIG. 3.
Figure 5:
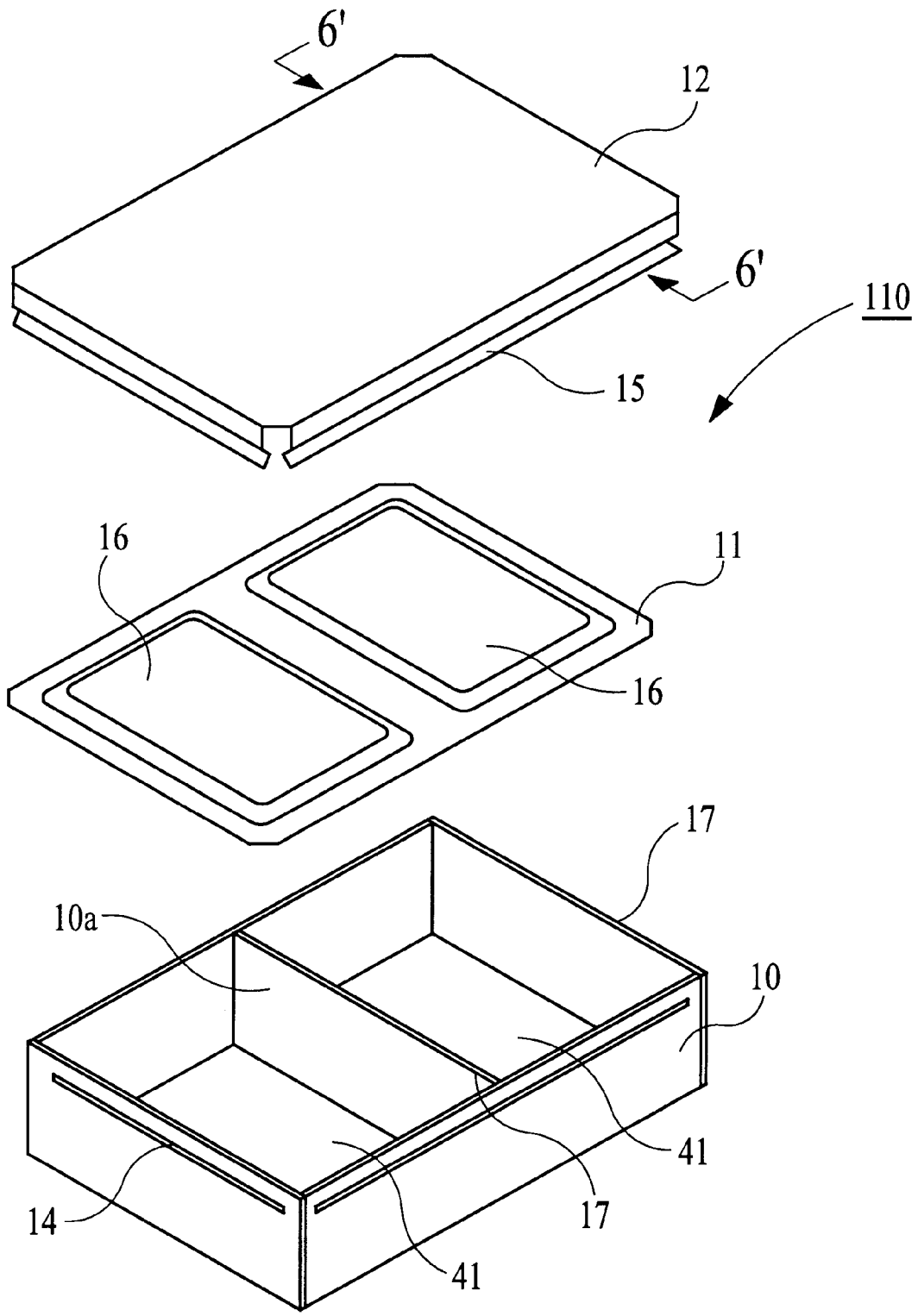
FIG. 5 is an exploded perspective view showing the construction of another conventional electronic parts casing.
Figure 6:
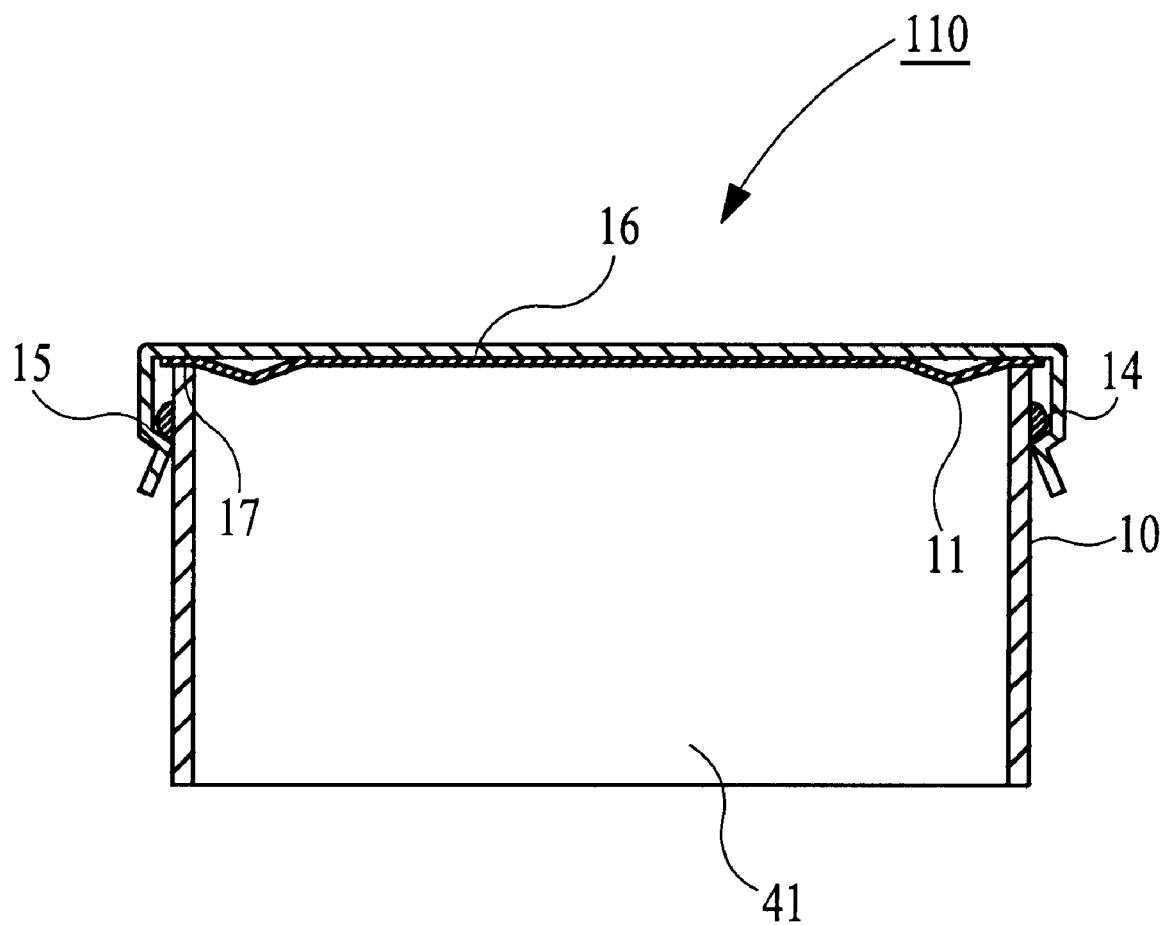
FIG. 6 is a sectional view taken along line 6'—6' of FIG. 5.

FIGS. 1 and 2 show an electronic parts casing 50 according to an embodiment of the present invention, which comprises a frame member 61, and an inner cover 62 and an outer cover 63 which cover the top of the frame member 61. The frame member 61 is divided into two chambers 80 by a partition 61a provided inside the frame member 61. On the outer side surfaces of the frame member 61, there are provided ridges 64 for the engagement of the outer cover 63. In the periphery of the outer cover 63, there are provided detents 65 that are to be engaged with the ridges 64 provided on the side surfaces of the frame member 61. On the top surface of the inner cover 62, there are provided two outwardly convex draw surfaces 66 in correspondence with the chambers 80, each draw surface 66 being defined by a respective inwardly convex draw portion 70 formed in the inner cover 62, each draw surface 66 having an area smaller than that of the corresponding chamber 80. On the top surface of the outer cover 62, there is provided an outwardly convex draw portion 67, and, defined within this outwardly convex draw portion 67, there is provided an inwardly convex draw surface 68.

As shown in FIG. 2, in the electronic parts casing 50, the inner cover 62 is placed so as to be brought into contact with the upper edges 69 of the frame member 61 and of the partition 61a, and the outwardly convex draw surfaces 66 provided on the inner cover 62 and the inwardly convex draw surface 68 provided on the outer cover 63 are brought into close contact with each other, the detents 65 provided on the outer cover 63 being engaged with the ridges 64 provided on the frame member 61 to thereby engage the outer cover 63 with the frame member 61 from above the inner cover 62.

The electronic parts casing 50 has a double structure, which comprises the inner cover 62 that is in contact with the edges 69 of the frame member 61 and of the partition 61a, and the outer cover 63 that is provided so as to pressurize the inner cover 62. The frame member 61 is divided into two chambers 80, each accommodating an electronic part 82 (shown schematically), such as a tuner substrate.

In the electronic parts casing 50, constructed as described above, the outward draw surfaces 66 of the inner cover 62 are brought into close contact with the inward draw surface 68 of the outer cover 63, and the detents 65 provided on the outer cover 63 are engaged with the ridges 64 provided on the frame member 61, whereby a resilient force is generated, and the inner cover 62 and the edges 69 of the frame member 61 and of the partition 61a are completely brought into close contact with each other, so that an RF signal, etc., generated in an electric part in one chamber 80 does not leak to the other chamber 80, thereby keeping the parts independent of each other.

Further, due to the convex draw portion 67 provided on the outer cover 63, the outer cover 63 does not undergo deformation such as warpage during the molding thereof, so the inner cover 62 and the outer cover 63 can be stably fixed to the frame member 61. Further, since no such tongue structure as that in the prior art is adopted, the inner cover 62 and the outer cover 63 can be mounted and detached easily, and a reduction is achieved in the height of the casing.

While the above-described casing 50 is divided into two chambers, it is also possible to divide the casing into a larger number of chambers.

As described above, in the electronic parts casing of the present invention, a convex draw portion is provided on the outer cover, whereby the outer cover is reinforced, and no deformation, such as warpage, is generated during working.

Further, the inner cover and the outer cover can be engaged with each other easily. Further, since the draw surfaces of the inner and outer covers are held in contact with each other, the covers can be stably fixed even if the engagement and detachment are effected a plurality of times.

Further, since the draw surfaces of the inner cover are provided in correspondence with the chambers of the frame member, leakage of an RF signal, etc., from one chamber to another can be prevented.

Further, since no such tongues for fixation as those provided in the conventional electronic parts casing are used, a reduction is achieved in the height and size of the casing.

Although the present invention has been described in relation to particular embodiments thereof, many other variations and modifications and other uses will become apparent to those skilled in the art. Therefore, the present invention is not limited by the specific disclosure herein.

What is claimed is:

1. An electronic parts casing comprising a frame member, and inner and outer covers for covering top edges of the frame member, said frame member being divided into a plurality of chambers, by a partition provided inside the frame member, said partition having top edges corresponding to the top edges of the frame member, said frame member having outer side surfaces with ridges for being engaged with said outer cover, said outer cover having at its periphery detents for being engaged with the ridges provided on the outer side surfaces of said frame member, said inner cover having on its top surface respective outwardly convex draw surfaces in correspondence with said plurality of chambers, each said outwardly convex draw surface having an area smaller than that of the corresponding chamber, each said outwardly convex draw surface being defined within an inwardly convex draw portion formed in said inner cover, said outer cover having on its bottom side an inwardly convex draw surface, said inwardly convex draw surface being defined within an outwardly convex draw portion formed in said outer cover, said inner cover being configured for being placed in contact with said top edges of said frame member and of said partition, the detents provided on said outer cover being configured for being engaged with the ridges provided on said frame member so that when said outer cover is engaged with said frame member and above said inner cover, the convex draw surfaces provided respectively on said inner cover and on said outer cover are held in close contact with each other.

2. An electronic parts casing as claimed in claim 1, further comprising an RF-signal-generating electronic part contained in at least one of said chambers, wherein said close contact of said respective convex draw surfaces on said inner and outer covers attenuates leakage of an RF signal generated by the electronic part from said at least one chamber.

3. An electronic parts casing as claimed in claim 1, wherein said frame member and said inner and outer covers are made of metal.

4. An electronic parts casing as claimed in claim 2, wherein said frame member and said inner and outer covers are made of metal.

5. An electronic parts casing comprising a frame member, and inner and outer covers for covering top edges of the frame member, said frame member defining at least one chamber, said frame member having side surfaces with engagement structures for being engaged with said outer cover, said outer cover having engagement structures for being engaged with the engagement structures provided on said frame member, said inner cover having on its top surface an outwardly convex draw surface in correspondence respectively with said at least one chamber, and having on its bottom surface an inwardly convex draw portion within which is defined said outwardly convex draw surface, said outer cover having on its top surface an outwardly convex draw portion, and having on its bottom side an inwardly convex draw surface which is defined within by said outwardly convex draw portion, said inner cover being configured for being placed in contact with said top edges of said frame member, the respective engagement structures provided on said outer cover and frame member being configured for being engaged with each other so that when said outer cover is engaged with said frame member and above said inner cover, the convex draw surfaces provided respectively on said inner cover and on said outer cover are held in close contact with each other.

6. An electronic parts casing as claimed in claim 5, said frame member being divided into a plurality of chambers by a partition provided inside the frame member, said partition having top edges corresponding to the top edges of the frame member, said inner cover having on its top surface outwardly convex draw surfaces in correspondence with said plurality of chambers.

7. An electronic parts casing as claimed in claim 6, wherein each said draw surface on said inner cover has an area smaller than that of the corresponding chamber.

8. An electronic parts casing as claimed in claim 5, wherein said outwardly convex draw surface on said inner cover has an area smaller than an area of said at least one chamber.

9. An electronic parts casing as claimed in claim 5, further comprising an RF-signal-generating electronic part contained in said at least one chamber, wherein said close contact of said respective convex draw surfaces on said inner and outer covers attenuates leakage of an RF signal generated by the electronic part from said at least one chamber.

10. An electronic parts casing as claimed in claim 5, wherein said frame member and said inner and outer covers are made of metal.

11. An electronic parts casing as claimed in claim 8, wherein said frame member and said inner and outer covers are made of metal.

12. An electronic parts casing as claimed in claim 9, wherein said frame member and said inner and outer covers are made of metal.

* * * * *